(12) United States Patent
Tsai et al.

(10) Patent No.: US 11,424,371 B2
(45) Date of Patent: Aug. 23, 2022

(54) MULTI-TRENCH SCHOTTKY DIODE

(71) Applicant: TAIWAN SEMICONDUCTOR CO., LTD., New Taipei (TW)

(72) Inventors: Yi-Lung Tsai, New Taipei (TW); Syed Sarwar Imam, New Taipei (TW); Yao-Wei Chuang, New Taipei (TW); Ming-Lou Tung, New Taipei (TW)

(73) Assignee: TAIWAN SEMICONDUCTOR CO., LTD., New Taipei (TW)

( * ) Notice: Subject to any disclaimer, the term of this patent is extended or adjusted under 35 U.S.C. 154(b) by 0 days.

(21) Appl. No.: 16/936,181

(22) Filed: Jul. 22, 2020

(65) Prior Publication Data

US 2021/0376169 A1   Dec. 2, 2021

(30) Foreign Application Priority Data

Jun. 2, 2020 (TW) ................................ 10911841.1

(51) Int. Cl.
   *H01L 29/872* (2006.01)
   *H01L 29/06* (2006.01)
   *H01L 29/10* (2006.01)

(52) U.S. Cl.
   CPC ...... *H01L 29/8725* (2013.01); *H01L 29/0696* (2013.01); *H01L 29/1095* (2013.01)

(58) Field of Classification Search
   CPC ......................... H01L 29/66712–66734; H01L 29/7802–7815; H01L 29/66666; H01L 29/7827–7828; H01L 29/78642; H01L 27/085–098; H01L 27/0922; H01L 27/105; H01L 27/11526; H01L 27/11546; H01L 29/08; H01L 29/083; H01L 29/0834; H01L 29/0839; H01L 29/1016; H01L 29/102; H01L 29/417; H01L 29/407;

(Continued)

(56) References Cited

U.S. PATENT DOCUMENTS 8,125,083 B2 *  2/2012 Carroll ................ H01L 23/3157
                                                        257/751
2008/0048254 A1 *  2/2008 Saka .................... H01L 27/0207
                                                        257/330

(Continued)

FOREIGN PATENT DOCUMENTS

WO   WO-2008094497 A1 *  8/2008 ........... H01L 29/407

*Primary Examiner* — Natalia A Gondarenko
(74) *Attorney, Agent, or Firm* — Muncy, Geissler, Olds & Lowe, P.C.

(57) ABSTRACT

A multi-trench schottky diode includes a semiconductor base layer, a back metal layer, an epitaxial layer, an interlayer dielectric layer, a first metal layer, a passivation layer and a second metal layer. The epitaxial layer on the semiconductor base layer includes a termination trench structure, a first trench structure, a second trench structure and a third trench structure. The dielectric layer is on the epitaxial layer in a termination area. The first metal layer stacked on the termination trench structure and the interlayer dielectric layer extends between the second trench structure and the third trench structure. The passivation layer is on the first metal layer and the interlayer dielectric layer. The second metal layer on the first metal layer and the passivation layer extends to the first trench structure. Thus, the electric field is dispersed and the voltage breakdown can be avoided with the trench structures in the termination area.

7 Claims, 4 Drawing Sheets

(58) Field of Classification Search
CPC ........... H01L 29/4175; H01L 29/41766; H01L 29/41775; H01L 29/41716; H01L 29/66143; H01L 29/66212; H01L 29/66257; H01L 29/7308; H01L 29/7839; H01L 29/7845; H01L 29/7846; H01L 27/0255; H01L 27/0262; H01L 27/0766; H01L 27/0811; H01L 27/0814; H01L 27/0817; H01L 27/095; H01L 27/1021; H01L 27/1027; H01L 2224/13155; H01L 2224/13021; H01L 2224/13144; H01L 24/13; H01L 29/8725; H01L 29/0696; H01L 29/1095; H01L 29/47; H01L 29/6606; H01L 29/66848; H01L 29/66962; H01L 29/872; H01L 29/782; H01L 29/404

See application file for complete search history.

(56) References Cited

U.S. PATENT DOCUMENTS

| | | | | |
|---|---|---|---|---|
| 2013/0168761 A1* | 7/2013 | Hsieh | .................. | H01L 29/0661 |
| | | | | 257/330 |
| 2018/0350968 A1* | 12/2018 | Aichinger | ........... | H01L 29/7806 |
| 2020/0006580 A1* | 1/2020 | Quddus | ............... | H01L 27/0727 |

* cited by examiner

MULTI-TRENCH SCHOTTKY DIODE

This application claims the benefit of Taiwan Patent Application Serial No. 109118411, filed Jun. 2, 2020, the subject matter of which is incorporated herein by reference.

BACKGROUND OF THE INVENTION

(1) Field of the Invention

The invention relates to a Schottky diode, and more particularly to a multi-trench Schottky diode having a plurality of trenches.

(2) Description of the Prior Art

Generally speaking, an ideal rectifier should be at least featured in a low forward voltage drop, a high reverse breakdown voltage and zero leakage current. For metal-semiconductor junctions are utilized as Schottky barriers to have characteristics in low forward voltage drop and high-speed switching, thus the Schottky diodes are widely applied to power rectifiers. However, since the Schottky diodes do have shortcomings in lower reverse bias and larger reverse leakage current, thus the applications of the Schottky diodes are substantially limited.

As described, the Schottky diodes are mainly classified into conventional planar Schottky diodes and trench Schottky diodes. A typical structure of the planar Schottky diodes is a stacking structure consisted of interchanging semiconductor layers and metal layers. As such, properties in the forward voltage drop and the leakage current shall be balanced. Namely, the topic in enhancing the breakdown voltage without increasing the leakage current is definitely welcome to the skilled in the art.

The trench Schottky diode is mainly formed by filling polysilicon into an etched trench of a silicon layer, such that the polysilicon in the trench can be used effectively to deplete drift electrons in a drift region, and thus the electric field distribution can be uniformed. In comparison to the conventional planar Schottky diode, the trench Schottky diode has much lower forward voltage drop (Low VF) and reverse leakage current (Low IR).

Referring to FIG. 1, a schematic cross-sectional view of a conventional trench Schottky diode is illustrated. As shown, the trench Schottky diode PA100 includes a semiconductor base layer PA1, a back metal layer PA2, an epitaxial layer PA3, a dielectric layer PA4, a first metal layer PA5, a passivation layer PA6 and a second metal layer PA7.

The back metal layer PA2 is formed on a back surface of the semiconductor base layer PA1, while the epitaxial layer PA3 is formed on a front surface of the semiconductor base layer PA1. The epitaxial layer is divided into a unit cell area PA3*a* and a termination area PA3*b* adjacent to each other. The epitaxial layer PA3 further includes a plurality of unit cell structures PA31 (two shown in the figure), a termination trench structure PA32 and a guard ring structure PA33. The plurality of unit cell structures PA31 are separately located in the unit cell area PA3*a*. The termination trench structure PA32 is located at a junction of the unit cell area PA3*a* and the termination area PA3*b*, and is separated from the neighboring unit cell structure PA31 in the termination area PA3*b*. The guard ring structure PA33 is adjacent to the termination trench structure PA32.

The dielectric layer PA4, disposed in the termination area PA3*b*, is stacked on the termination trench structure PA32 and the guard ring structure PA33. The first metal layer PA5 is stacked on the epitaxial layer PA3 in the unit cell area PA3*a*, and extended to stack the dielectric layer PA4 in the termination area PA3*b*. The passivation layer PA6 is stacked on the first metal layer PA5, and extended to the dielectric layer PA4 in the termination area PA3*b* from the unit cell area PA3*a*. The second metal layer PA7 is stacked on the first metal layer PA5 and the passivation layer PA6, and extended from the unit cell area PA3*a* to the termination area PA3*b*.

As described above, the conventional trench Schottky diode PA100 is mainly to extend the first metal layer PA5 and the second metal layer PA7 to the termination area PA3*b* so as increase the reverse bias, and to furnish the guard ring structure PA33 to the epitaxial layer PA3 so as to distribute the voltage level. However, since the guard ring structure PA33 can only provide limited ability to buffer the voltage level, thus electric charges of the trench Schottky diode PA100 would be clustered to the rim of the termination area PA3*b*, from which an early breakdown would be possible.

SUMMARY OF THE INVENTION

In order to increase the reverse bias of the conventional trench Schottky diode, the first metal layer and the second metal layer thereof are extended into the termination area, and thus surface charges would be easy to be accumulated on the epitaxial layer. Though the conventional trench Schottky diode is furnished with the guard ring structure to avoid severe variations in voltage levels, yet the corresponding improvement is still limited anyway. Accordingly, it is an object of the present invention to provide a Schottky diode that can reduce accumulation of surface charges through structural changes, such that an early breakdown can be avoided.

In the present invention, a multi-trench Schottky diode includes a semiconductor base layer, a back metal layer, an epitaxial layer, an interlayer dielectric (ILD) layer, a first metal layer, a passivation layer and a second metal layer.

The back metal layer is formed on the back surface of the semiconductor base layer. The epitaxial layer is formed on the front surface of the semiconductor base layer, and has a unit cell area and a termination area. The epitaxial layer further includes a termination trench structure, a first trench structure, a second trench structure and a third trench structure.

The termination trench structure is disposed at a junction of the unit cell area and the termination area. The first trench structure is disposed in the termination area by neighboring to the termination trench structure, and has a first width. The second trench structure is disposed in the termination area, separated from the first trench structure, and has a second width less than the first width. The third trench structure is disposed in the termination area and separated from the second trench structure, and has a third width less than the second width.

The ILD layer is stacked on the termination trench structure, the first trench structure, the second trench structure and the third trench structure in the termination area, and has a first ILD-layer trench, a second ILD-layer trench and a third ILD-layer trench to be formed at the first trench structure, the second trench structure and the third trench structure, respectively.

The first metal layer is stacked on the termination trench structure in the unit cell area and extended from the unit cell area to a place between the second trench structure and the third trench structure in the termination area, and further has a first metal-layer trench and a second metal-layer trench to be formed at the first ILD-layer trench and the second ILD-layer trench, respectively.

The passivation layer is stacked on the first metal layer in the unit cell area and extended from the unit cell area to be stacked on the metal layer and the third ILD-layer trench in the termination area, and further has a first passivation-layer trench, a second passivation-layer trench and a third passivation-layer trench to be formed at first metal layer, the second metal-layer trench and the third ILD-layer trench, respectively.

The second metal layer coats the first metal layer and the passivation layer in the unit cell area, and extends from the unit cell area to be partly stacked on the first passivation-layer trench in the termination area.

In one embodiment of the present invention, a ratio of the first width, the second width and the third width is 7:5:3

In one embodiment of the present invention, the IDL layer includes a TEOS film and a BPSG film, the TEOS film is stacked on the epitaxial layer in the termination area, and the BPSG film is stacked on the TEOS film in the termination area.

In one embodiment of the present invention, the epitaxial layer further includes a plurality of cell trench structures, and each of the plurality of cell trench structures includes a gate oxide layer and a polysilicon layer. The gate oxide layer is formed in the unit cell area. The polysilicon layer is formed in the gate oxide layer.

In one embodiment of the present invention, the termination trench structure further includes a gate oxide layer and a polysilicon layer. The gate oxide layer is formed in the unit cell area and the termination area. The polysilicon layer is formed in the gate oxide layer. Preferably, the first metal layer includes a nickel-platinum alloy layer stacked on the epitaxial layer and electrically contacting the polysilicon layer. In addition, the first metal layer includes a titanium layer, a titanium-tungsten alloy layer and an aluminum layer; the titanium layer is stacked on the nickel-platinum alloy layer and the ILD layer, and extends from the unit cell area to another place between the second trench structure and the third trench structure in the termination area; and, the titanium-tungsten alloy layer is stacked on the titanium layer, the aluminum layer is further stacked on the titanium-tungsten alloy layer.

In one embodiment of the present invention, the second metal layer includes a titanium layer, a nickel layer and a silver layer. The titanium layer is stacked on the first metal layer and the passivation layer, and extends from the unit cell area to be partly stacked on the first passivation-layer trench in the termination area. The nickel layer is stacked on the titanium layer. The silver layer is stacked on the nickel layer.

In one embodiment of the present invention, the epitaxial layer further includes a plurality of cell trench structures disposed in the unit cell area.

As stated, the multi-trench Schottky diode provided by the present invention furnishes the termination area with the first trench structure, the second trench structure and the third trench structure, and also extends the first metal layer to a place between the second trench structure and the third trench structure, such that the electric field distribution of the termination area can be effectively scattered without the electric field to be over concentrated on the termination area. In addition, with the descending arrangement upon the first trench structure, the second trench structure and the third trench structure, the voltages in the termination area can be gradually lifted up so as to avoid possible early voltage breakdown.

All these objects are achieved by the multi-trench Schottky diode described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to a multi-trench Schottky diode. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 2:
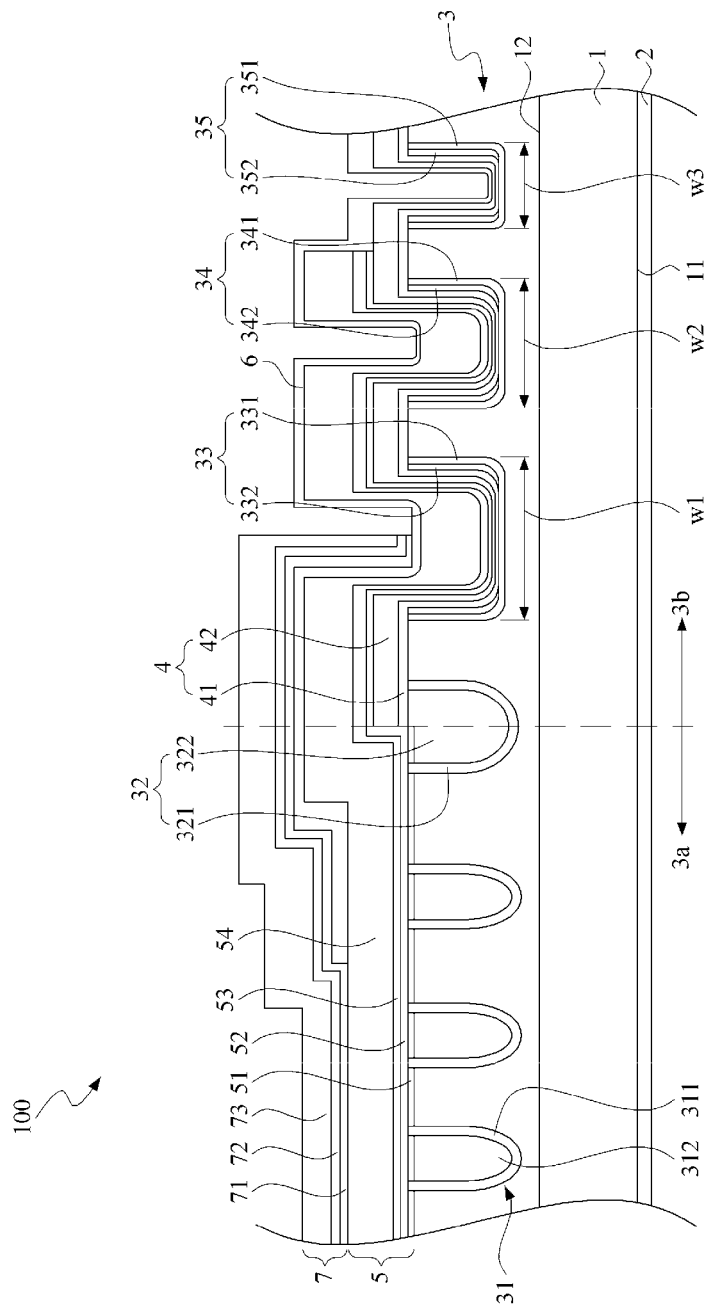
FIG. 2 is a schematic cross-sectional view of a preferred embodiment of the multi-trench Schottky diode in accordance with the present invention.

Referring to FIG. 2, a schematic cross-sectional view of a preferred embodiment of the multi-trench Schottky diode in accordance with the present invention is shown. As illustrated, the multi-trench Schottky diode 100 includes a semiconductor base layer 1, a back metal layer 2, an epitaxial layer 3, an ILD layer 4, a first metal layer 5, a passivation layer 6 and a second metal layer 7.

The semiconductor base layer 1, having a back surface 11 and a front surface 12 thereof opposite to each other, is an N-type heavily-doped silicon layer. The back metal layer 2 is formed on the back surface 11 of the semiconductor base layer 1. The epitaxial layer 3, formed on the front surface 12 of the semiconductor base layer 1, has a unit cell area 3a and a termination area 3b neighboring to the unit cell area 3a. In this embodiment, the epitaxial layer 3 is an N-type lightly-doped silicon layer, in which the light doping of the epitaxial layer 3 is compared to the heavy doping of the semiconductor base layer 1. In addition, the epitaxial layer 3 includes a plurality of cell trench structures 31 (one labeled in the figure), a termination trench structure 32, a first trench structure 33, a second trench structure 34 and a third trench structure 35.

The plurality of cell trench structures 31 are disposed in the unit cell area 3a by being separated to each other. Each of the cell trench structures 31 includes a gate oxide layer 311 and a polysilicon layer 312. The termination trench structure 32 is disposed at the junction of the unit cell area 3a and the termination area 3b. In other words, the termination trench structure 32 is across the unit cell area 3a and the termination area 3b. In this embodiment, the termination trench structure 32 further includes another gate oxide layer 321 and another polysilicon layer 322 (one labeled in the figure). The gate oxide layer 321 is formed to both the unit cell area 3a and the termination area 3b. The polysilicon layer 322 is formed to two sides of the gate oxide layer 321. The gate oxide layer 321 and the polysilicon layer 322 are formed by forming a groove on the epitaxial layer 3, then oxidizing an inner wall of the groove so as to form the gate oxide layer 321, and finally the polysilicon is fed to both inner walls of the groove so as to form the polysilicon layer 322. Thus, the polysilicon layer 322 is formed continuously to both sides of the gate oxide layer.

The first trench structure 33, disposed in the termination area 3b by neighboring to the termination trench structure 32, has a first width w1, and further includes a gate oxide layer 331 and two polysilicon layers 332 (one labeled in the figure). The gate oxide layer 331 is disposed in the termination area 3b, and the two polysilicon layers 332 are formed to two opposite sidewalls of the gate oxide layer 331. The second trench structure 34, disposed in the termination area 3b and separated from the first trench structure 33, has a second width w2 less than the first width w1, and further includes a gate oxide layer 341 and two polysilicon layers 342 (one labeled in the figure). The gate oxide layer 341 is disposed in the termination area 3b, and two polysilicon layers 342 are formed to two opposite sidewalls of the gate oxide layer 341. The third trench structure 35, disposed in the termination area 3b and separated from the second trench structure 34, has a third width w3 less than the second width w2, and further includes a gate oxide layer 351 and two polysilicon layer 352 (one labeled in the figure). The gate oxide layer 351 is disposed in the termination area 3b, and the two polysilicon layers 352 are formed to two opposite sidewalls of the gate oxide layer 351.

In this embodiment, a ratio of the first width w1, the second width w2 and the third width w3 is 7:5:3. In particular, the first width w1 can be 14 μm, the second width w2 can be 10 μm, the third width w3 can be 6 μm, the spacing between the first trench structure 33 and the second trench structure 34 is 2.8 μm, and the spacing between the second trench structure 34 and the third trench structure 35 is 2.8 μm.

The ILD layer 4 includes a tetraethyl orthosilicate (TEOS) film 41 and a borophosphosilicate glass (BPSG) film 42. The TEOS film 41 is stacked on the termination trench structure 32, the first trench structure 33, the second trench structure 34 and the third trench structure 35 of the epitaxial layer 3 in the termination area 3b. The TEOS film 41 further forms a first TEOS trench (not labeled in the figure), a second TEOS trench (not labeled in the figure) and a third TEOS trench (not labeled in the figure) at the first trench structure 33, the second trench structure 34 and the third trench structure 35, respectively. The BPSG film 42 is stacked on the first TEOS trench, the second TEOS trench and the third TEOS trench of the TEOS film 41 in the termination area 3b. The BPSG film 42 further forms a first ILD layer trench (not labeled in the figure), a second ILD layer trench (not labeled in the figure) and a third ILD layer trench (not labeled in the figure) at the first trench structure 33, the second trench structure 34 and the third trench structure 35, respectively.

The first metal layer 5 includes a nickel-platinum alloy layer 51, a titanium layer 52, a titanium-tungsten alloy layer 53 and an aluminum layer 54. In this embodiment, the passivation layer 6 is a silicon nitride layer. The titanium layer 52 is stacked on the nickel-platinum alloy layer 51 and the BPSG film 42 of the ILD layer 4, and extends from the unit cell area 3a to a position between the second trench structure 34 and the third trench structure 35 in the termination area 3b. The titanium layer 52 further forms a first titanium-layer trench (not labeled in the figure) and a second titanium-layer trench (not labeled in the figure) at the first ILD-layer trench and the second ILD-layer trench, respectively. The titanium-tungsten alloy layer 53 is stacked on the titanium layer 52, and extends from the unit cell area 3a to a position between the second trench structure 34 and the third trench structure 35 in the termination area 3b. The titanium-tungsten alloy layer 53 further forms a first titanium-tungsten-alloy-layer trench (not labeled in the figure) and a second titanium-tungsten-alloy-layer trench (not labeled in the figure) at the first titanium-layer trench and the second titanium-layer trench, respectively. The aluminum layer 54 is stacked on the titanium-tungsten alloy layer 53, and extends from the unit cell area 3a to a place between the second trench structure 34 and the third trench structure 35 in the termination area 3b. The aluminum layer 54 further forms a first metal-layer trench (not labeled in the figure) and a second metal-layer trench (not labeled in the figure) at the first titanium-tungsten-alloy-layer trench and the second titanium-tungsten-alloy-layer trench.

The passivation layer 6 is stacked on the aluminum layer 54 of the first metal layer 5 in the unit cell area 3a, and extends from the unit cell area 3a to the termination area 3b to be stacked on the first metal layer 5 and the third ILD-layer trench. The passivation layer 6 further forms a second passivation-layer trench (not labeled in the figure) and a third passivation-layer trench (not labeled in the figure) at the first metal-layer trench, the second metal-layer trench and the third ILD-layer trench, respectively. In this embodiment, the passivation layer 6 is a silicon nitride layer.

The second metal layer 7 includes a titanium layer 71, a nickel layer 72 and a silver layer 73. The titanium layer 71 is stacked on the aluminum layer 54 of the first metal layer 5 and the passivation layer 6 in the unit cell area 3a, and extends from the unit cell area 3a to be partly stacked on the first passivation-layer trench in the termination area 3b. The nickel layer 72 is stacked on the titanium layer 71 in the unit cell area 3a, and extends from the unit cell area 3a to be stacked on the titanium layer 71 at the first passivation-layer trench in the termination area 3b. The silver layer 73 is stacked on the nickel layer 72 in the unit cell area 3a, and extends from the unit cell area 3a to be stacked on the nickel layer 72 at the first passivation-layer trench in the termination area 3b.

Figure 3:
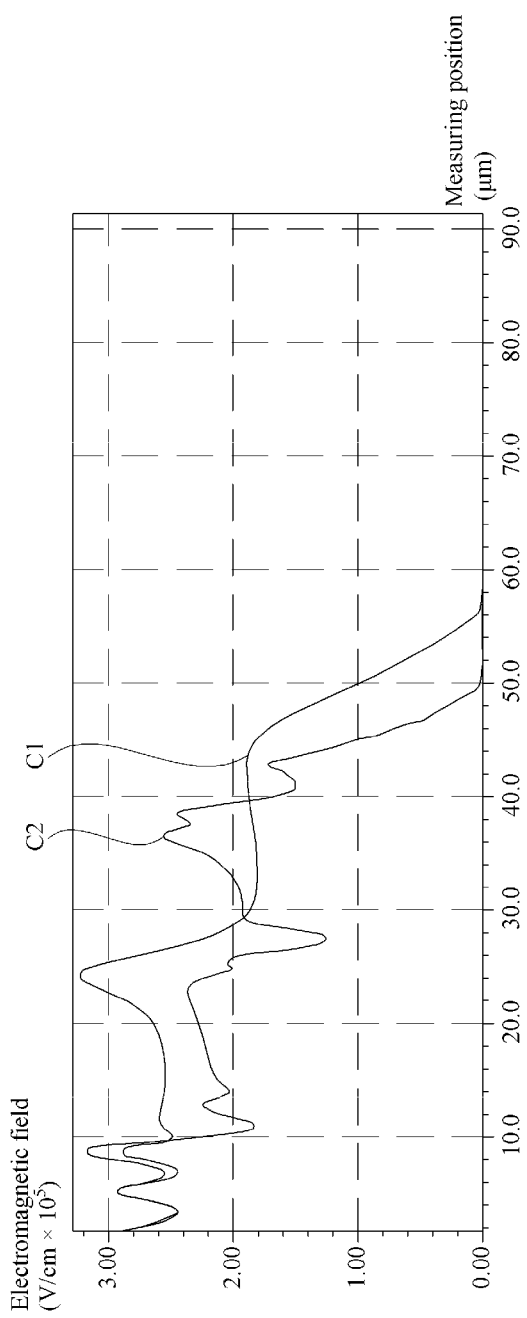
FIG. 3 demonstrates schematically electromagnetic field distribution curves of the multi-trench Schottky diode of FIG. 2.
Figure 4:
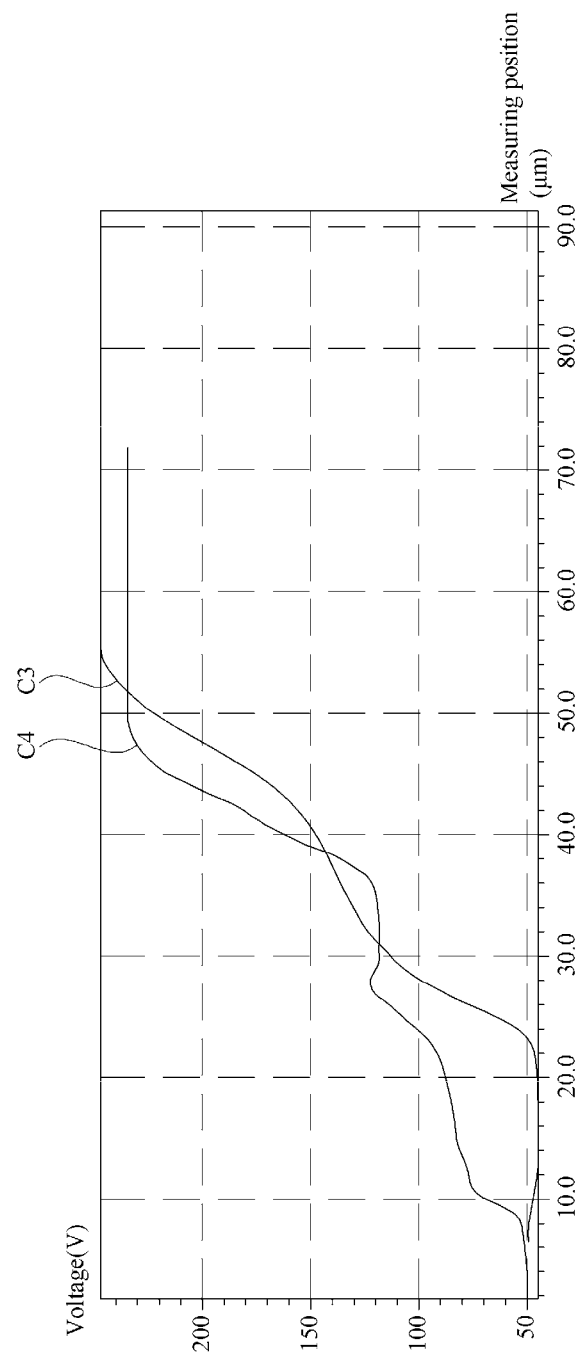
FIG. 4 demonstrates schematically voltage curves of the multi-trench Schottky diode of FIG. 2.

Refer to FIG. 3 and FIG. 4; where FIG. 3 demonstrates schematically electromagnetic field distribution curves of the multi-trench Schottky diode of FIG. 2, and FIG. 4 demonstrates schematically voltage curves of the multi-trench Schottky diode of FIG. 2.

Figure 1:
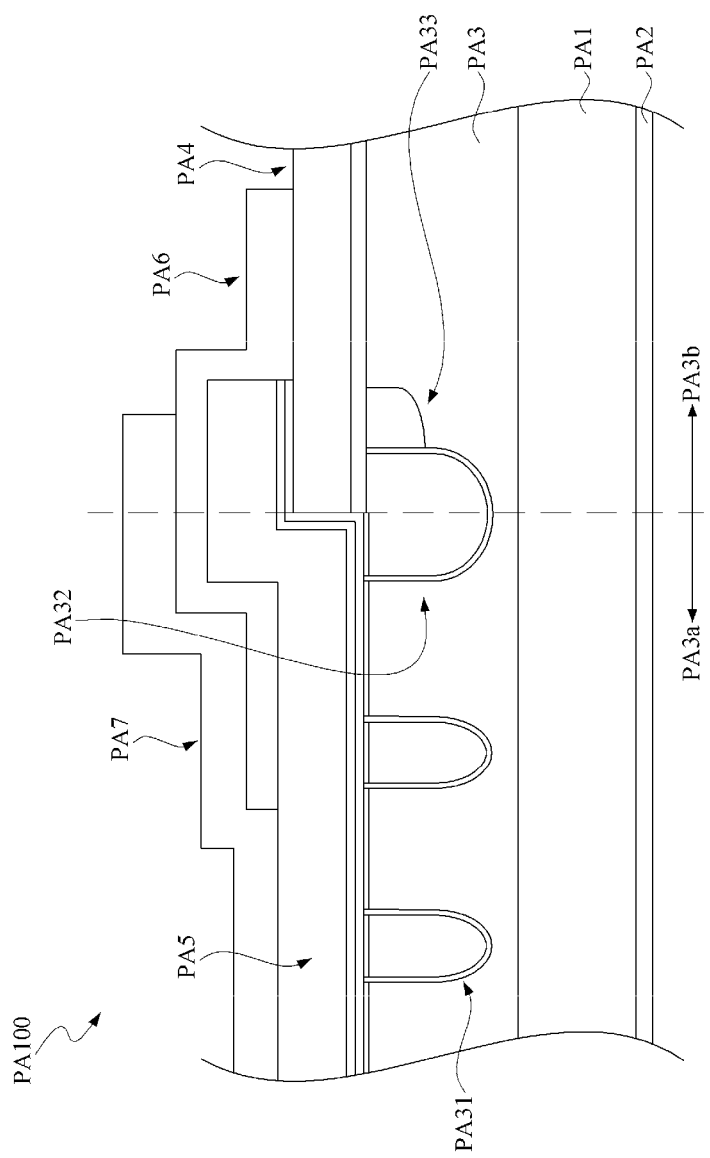
FIG. 1 is a schematic cross-sectional view of a conventional trench Schottky diode.

As shown in FIG. 1 through FIG. 3, Curve C1 of FIG. 3 is accounted for the electromagnetic field distribution of the conventional trench Schottky diode PA100 of FIG. 1, while Curve C2 thereof is accounted for the electromagnetic field distribution of the multi-trench Schottky diode 100 provided by the present invention as shown in FIG. 2. Respective to the unit cell structure PA31 in the unit cell area PA3a, Curve C1 there has a higher electric field between 0-10 μm. However, since the first metal layer PA5 is extended to the termination area PA3b, thus some electric charges would be accumulated to edges of the first metal layer PA5, such that the electric field of Curve C1 would rise again at about the 25 μm measurement position. For comparison, though the multi-trench Schottky diode 100 provided by the present invention extends the first metal layer 5 to a place between the second trench structure 34 and the third trench structure 35 in the termination area 3b, yet, since the first metal-layer trench and the second metal-layer trench of the first metal layer 5 are formed at the first trench structure 33 and the second trench structure 34, thus the electric fields of the multi-trench Schottky diode 100 at 10-14 μm of the first metal-layer trench and the 26-30 μm of the second metal-layer trench would be effectively reduced. Thereupon, the electric field distribution of the entire termination area 3b would be much more scattered without over concentration locally. In addition, the electric distribution in the termination area 3b can be effectively scattered due to the extension of the first metal layer 5 to a place between the second trench structure 34 and the third trench structure 35 in the termination area 3b, and thus higher electric fields can be driven away from the cell trench structure 31 in the unit cell area 3a. Upon such an arrangement, Schottky contact at the cell trench structure 31 can be prevented from interference of high electric fields.

On the other hand, as shown in FIG. 4, Curve C3 of FIG. 4 is accounted for variation in voltage variation of the conventional trench Schottky diode PA100 of FIG. 1, while Curve C4 thereof is accounted for the voltage variation of the multi-trench Schottky diode 100 provided by the present invention as shown in FIG. 2. Since the guide ring structure PA33 of the conventional trench Schottky diode PA100 has a measurement position between 10-20 μm, thus the voltages there at Curve C1 demonstrate levels lower than 50V. However, after the guide ring structure PA33 is passed, the voltage would severely vary and rise to almost 250V, by which early voltage breakdown would be expected. On the other hand, since the multi-trench Schottky diode 100 of the present invention utilizes the descending arrangement of the first width w1 of the first trench structure 33, the second width w2 of the second trench structure 34, and the third width w3 of the third trench structure 35, and the extension of the first metal layer 5 to a place between the second trench structure 34 and the third trench structure 35, thus an ascending variation at voltages of the multi-trench Schottky diode 100 can be provided to avoid a risk in early voltage breakdown.

In summary, in comparison with the conventional trench Schottky diode who extends both the first metal layer and the second metal layer into the termination area so as to increase the reverse bias but inevitably lead to accumulate excessive surface charges on the epitaxial layer, the multi-trench Schottky diode provided by the present invention furnishes the termination area with the first trench structure, the second trench structure and the third trench structure, and also extends the first metal layer to a place between the second trench structure and the third trench structure, such that the electric field distribution of the termination area can be effectively scattered without the electric field to be over concentrated on the termination area. In addition, with the descending arrangement upon the first trench structure, the second trench structure and the third trench structure, the voltages in the termination area can be gradually lifted up so as to avoid possible early voltage breakdown.

While the present invention has been particularly shown and described with reference to a preferred embodiment, it will be understood by those skilled in the art that various changes in form and detail may be without departing from the spirit and scope of the present invention.

What is claimed is:

1. A multi-trench Schottky diode, comprising:
    a semiconductor base layer, having a back surface and a front surface opposite to the back surface;
    a back metal layer, formed on the back surface of the semiconductor base layer;
    an epitaxial layer, formed on the front surface of the semiconductor base layer, having a unit cell area and a termination area, including:
        a termination trench structure, disposed at a junction of the unit cell area and the termination area;
        a first trench structure, disposed in the termination area by neighboring to the termination trench structure, having a first width;
        a second trench structure, disposed in the termination area, separated from the first trench structure, having a second width less than the first width; and
        a third trench structure, disposed in the termination area, separated from the second trench structure, having a third width less than the second width;
    an interlayer dielectric (ILD) layer, stacked on the termination trench structure, the first trench structure, the second trench structure and the third trench structure in the termination area, having a first ILD-layer trench, a second ILD-layer trench and a third ILD-layer trench to be formed at the first trench structure, the second trench structure and the third trench structure, respectively;
    a first metal layer, stacked on the termination trench structure and extended from the unit cell area to cover only the first trench structure and the second trench structure further having a first metal-layer trench and a second metal-layer trench to be formed at the first ILD-layer trench and the second ILD-layer trench, respectively;
    a passivation layer, stacked on the first metal layer in the unit cell area and extended from the unit cell area to be stacked on the first metal layer and the third ILD-layer trench in the termination area, further having a first passivation-layer trench, a second passivation-layer trench and a third passivation-layer trench to be formed at the first metal layer, the second metal-layer trench and the third ILD-layer trench, respectively; and
    a second metal layer, coating the first metal layer and the passivation layer in the unit cell area and extending from the unit cell area to be partly stacked on the first passivation-layer trench in the termination area;
    wherein the interlayer dielectric layer completely separates the epitaxial layer and the first metal layer;
    wherein a ratio of the first width, the second width and the third width is 7:5:3.

2. The multi-trench Schottky diode of claim 1, wherein the IDL layer includes a TEOS film and a BPSG film, the TEOS film is stacked on the epitaxial layer in the termination area, and the BPSG film is stacked on the TEOS film in the termination area.

3. The multi-trench Schottky diode of claim 1, wherein the epitaxial layer further includes a plurality of cell trench structures, and each of the plurality of cell trench structures includes:
    a gate oxide layer, formed in the unit cell area; and
    a polysilicon layer, formed in the gate oxide layer.

4. The multi-trench Schottky diode of claim 1, wherein the termination trench structure further includes:
    a gate oxide layer, formed in the unit cell area and the termination area; and
    a polysilicon layer, formed in the gate oxide layer.

5. The multi-trench Schottky diode of claim 4, wherein the first metal layer includes a nickel-platinum alloy layer stacked on the epitaxial layer and electrically contacting the polysilicon layer.

6. The multi-trench Schottky diode of claim 5, wherein the first metal layer includes a titanium layer, a titanium-tungsten alloy layer and an aluminum layer; the titanium layer is stacked on the nickel-platinum alloy layer and the ILD layer, and extends from the unit cell area to another place between the second trench structure and the third trench structure in the termination area; and the titanium-tungsten alloy layer is stacked on the titanium layer, the aluminum layer is further stacked on the titanium-tungsten alloy layer.

7. The multi-trench Schottky diode of claim 1, wherein the second metal layer includes a titanium layer, a nickel layer and a silver layer; the titanium layer is stacked on the first metal layer and the passivation layer, and extends from the unit cell area to be partly stacked on the first passivation-layer trench in the termination area; the nickel layer is stacked on the titanium layer; and the silver layer is stacked on the nickel layer.

* * * * *